United States Patent
Takahashi et al.

(10) Patent No.: US 12,500,091 B2
(45) Date of Patent: *Dec. 16, 2025

(54) ETCHING METHOD, METHOD OF REMOVING ETCHING RESIDUE, AND STORAGE MEDIUM

(71) Applicant: Tokyo Electron Limited, Tokyo (JP)

(72) Inventors: Nobuhiro Takahashi, Nirasaki (JP); Keiji Tanouchi, Nirasaki (JP); Shinji Irie, Nirasaki (JP); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 728 days.

This patent is subject to a terminal disclaimer.

(21) Appl. No.: 17/277,578

(22) PCT Filed: Jun. 24, 2019

(86) PCT No.: PCT/JP2019/024959
§ 371 (c)(1),
(2) Date: Mar. 18, 2021

(87) PCT Pub. No.: WO2020/066172
PCT Pub. Date: Apr. 2, 2020

(65) Prior Publication Data
US 2021/0358761 A1    Nov. 18, 2021

(30) Foreign Application Priority Data
Sep. 26, 2018    (JP) .................. 2018-180128

(51) Int. Cl.
*H01L 21/311*    (2006.01)
*H01J 37/32*    (2006.01)
(Continued)

(52) U.S. Cl.
CPC .. *H01L 21/31116* (2013.01); *H01J 37/32357* (2013.01); *H01J 37/3244* (2013.01);
(Continued)

(58) Field of Classification Search
CPC ......... H01L 21/31116; H01L 21/02334; H01L 21/3065; H01L 21/02063; H01L 21/76814;
(Continued)

(56) References Cited

U.S. PATENT DOCUMENTS

| | | | | |
|---|---|---|---|---|
| 6,376,383 B2 * | 4/2002 | Mitsuiki | ............. | H01L 21/3065 438/712 |
| 11,557,486 B2 * | 1/2023 | Shimizu | ............ | H01L 21/31116 |

(Continued)

FOREIGN PATENT DOCUMENTS

| | | |
|---|---|---|
| JP | H06236864 A | 8/1994 |
| JP | H10256232 A | 9/1998 |

(Continued)

*Primary Examiner* — Su C Kim
(74) *Attorney, Agent, or Firm* — Armstrong Teasdale LLP

(57) ABSTRACT

An etching method includes a step of preparing a substrate having a portion to be etched, a step of plasma-etching the portion to be etched of the substrate into a predetermined pattern using plasma of a processing gas containing a CF-based gas, and then a step of removing a CF-based deposit which remains as an etching residue. The step of removing the CF-based deposit includes a step of forming an oxide including an oxide of the CF-based deposit using oxygen-containing radicals, and a step of removing the generated oxide by radical processing or chemical processing using gas.

27 Claims, 12 Drawing Sheets

(51) Int. Cl.
*H01L 21/02* (2006.01)
*H01L 21/3065* (2006.01)

(52) U.S. Cl.
CPC .... *H01L 21/02334* (2013.01); *H01L 21/3065* (2013.01); *H01J 2237/334* (2013.01)

(58) Field of Classification Search
CPC .......... H01L 21/02164; H01J 37/32357; H01J 37/3244; H01J 2237/334
See application file for complete search history.

(56) References Cited

U.S. PATENT DOCUMENTS

| | | | |
|---|---|---|---|
| 2001/0005638 A1* | 6/2001 | Yang | H01L 21/31116 257/E21.252 |
| 2005/0106888 A1* | 5/2005 | Chiu | H01L 21/02063 257/E21.252 |
| 2008/0132074 A1* | 6/2008 | Kim | H01L 29/1037 257/E21.429 |
| 2010/0093179 A1* | 4/2010 | Hori | H01L 21/31116 438/723 |

FOREIGN PATENT DOCUMENTS

| | | | |
|---|---|---|---|
| JP | 2001176855 A | 6/2001 |
| JP | 2005039185 A | 2/2005 |
| JP | 2007266609 A | 10/2007 |
| JP | 2015523734 A | 8/2015 |
| JP | 2018093189 A | 6/2018 |

\* cited by examiner

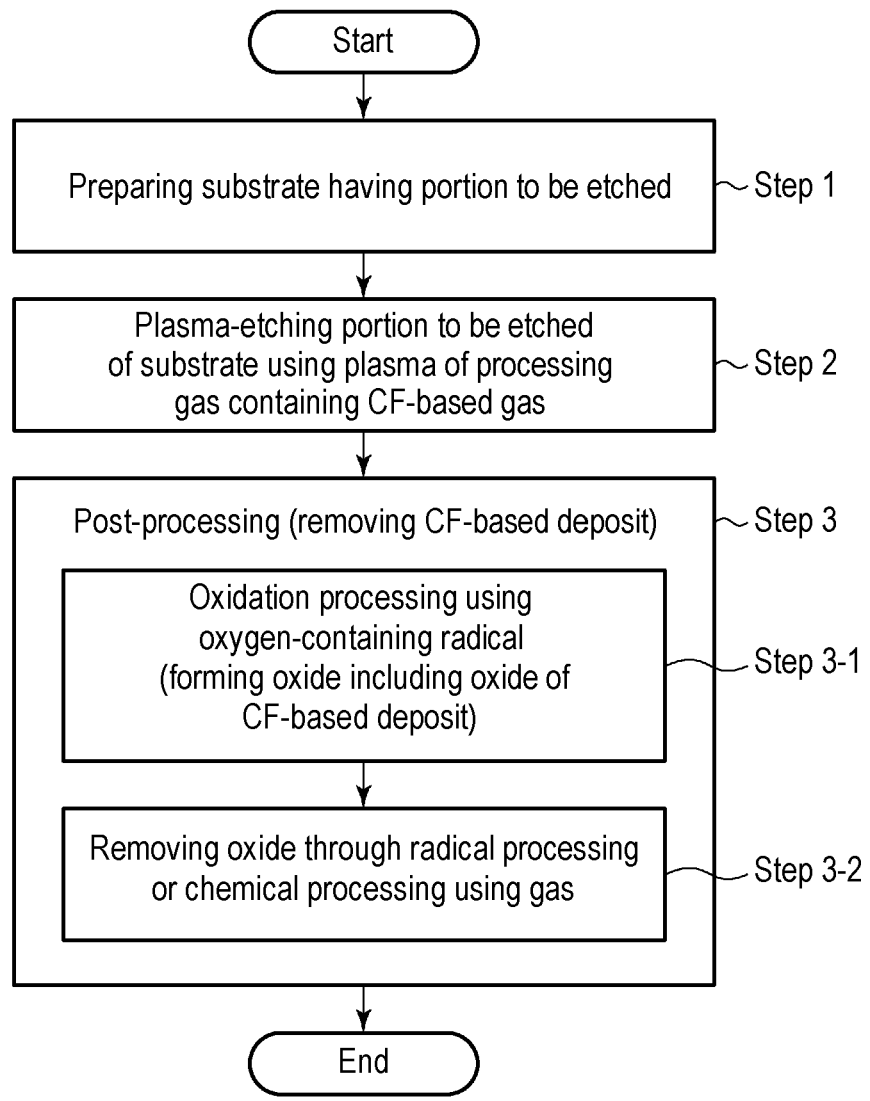

After etching

After processing using oxygen-containing radical

After oxide removal processing

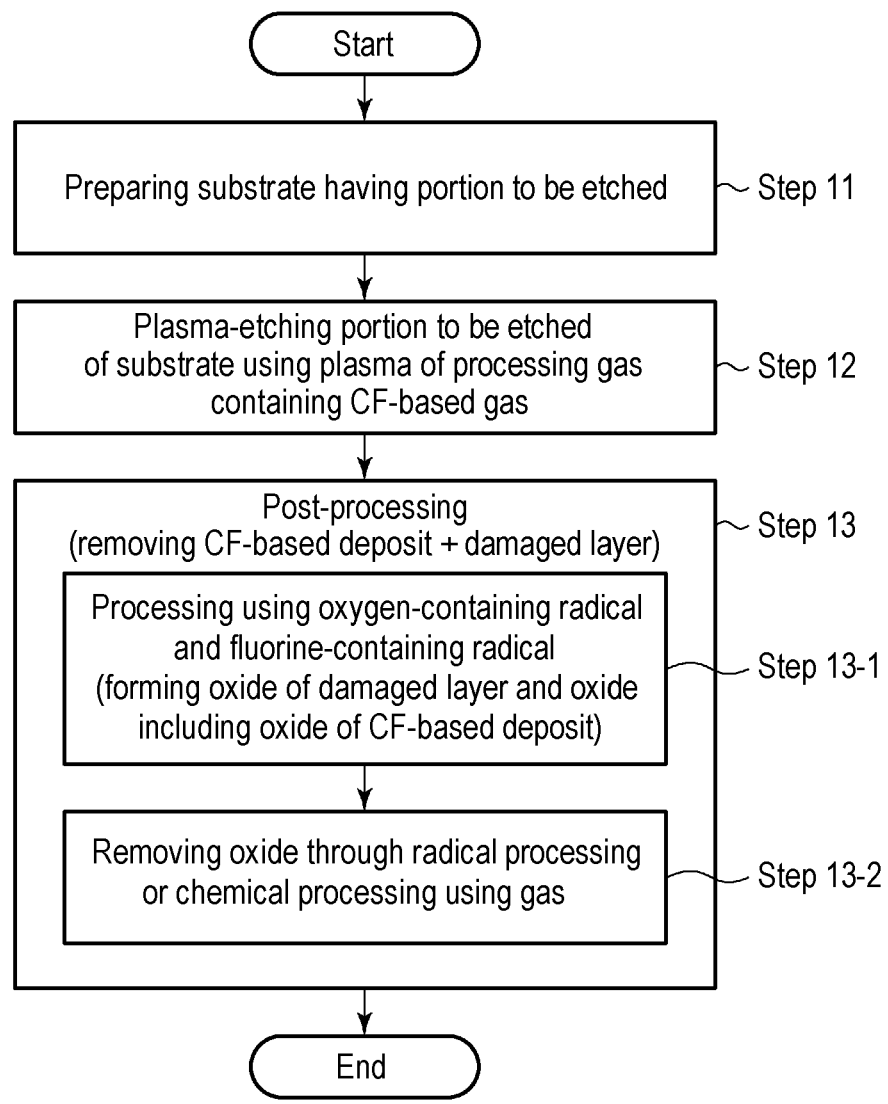

After etching

After processing using
oxygen-containing radical
and fluorine-containing radical

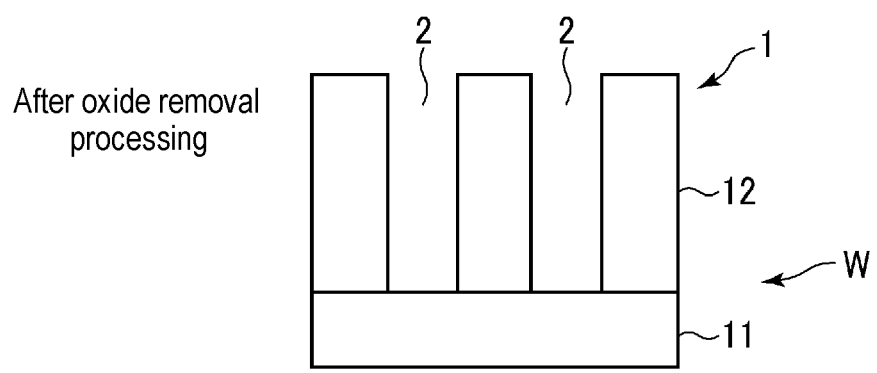

After oxide removal processing

After etching

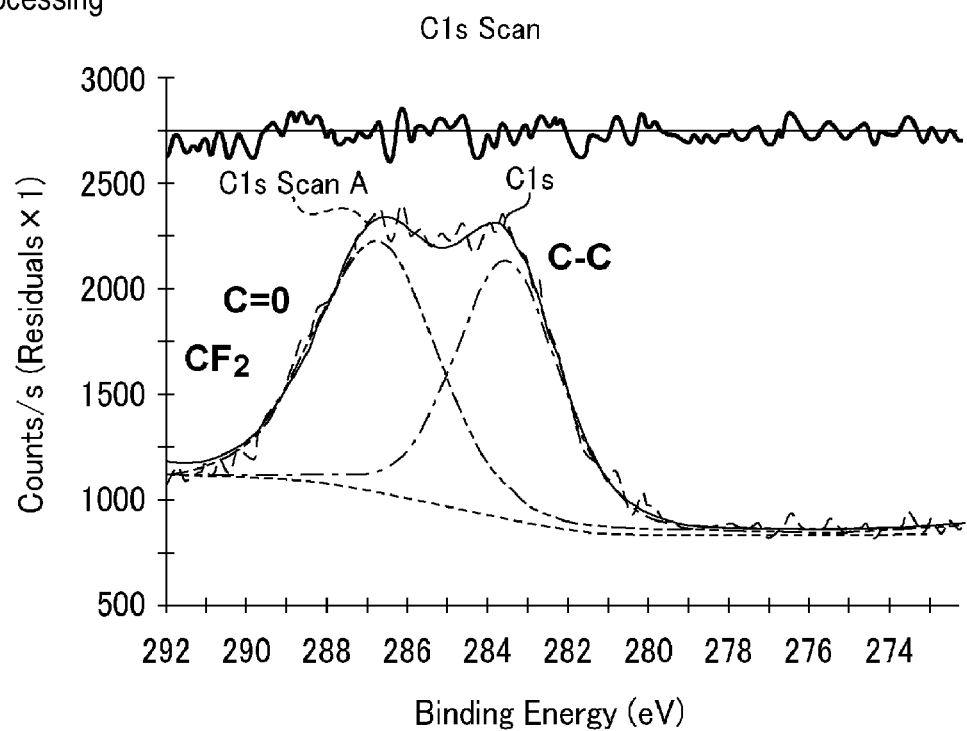

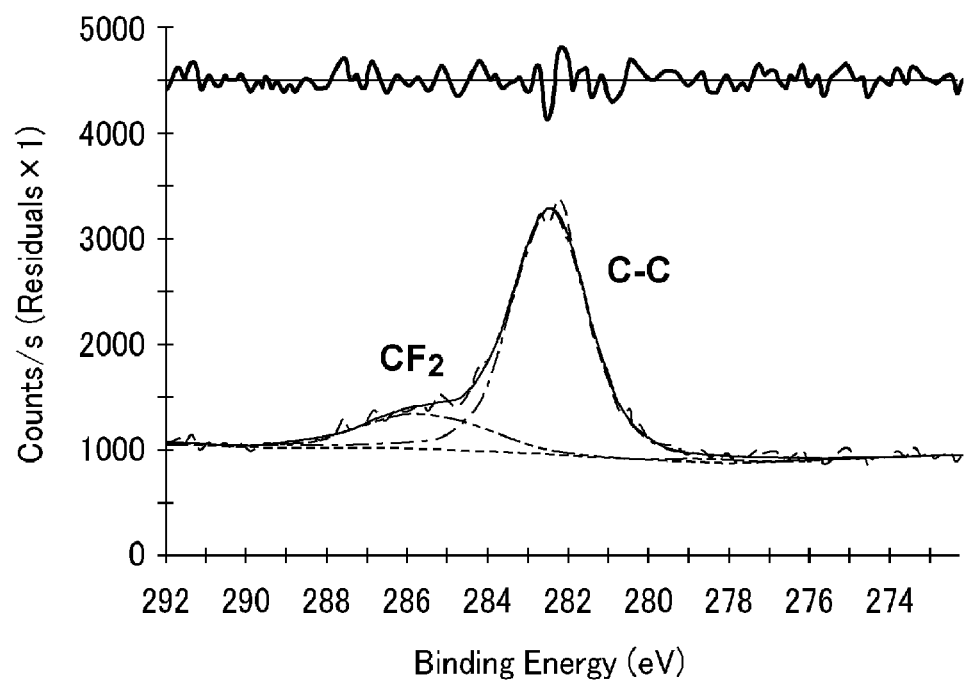

US 12,500,091 B2

ETCHING METHOD, METHOD OF REMOVING ETCHING RESIDUE, AND STORAGE MEDIUM

CROSS-REFERENCE TO RELATED APPLICATIONS

This application is a National Stage Application of International Patent Application No. PCT/JP2019/024959, having an International Filing Date of Jun. 24, 2019, which claims the benefit of priority to Japanese Patent Application No. 2018-180128, filed Sep. 26, 2018, the entire contents of each of which are hereby incorporated by reference herein.

TECHNICAL FIELD

The present disclosure relates to an etching method, a method of removing etching residue, and a storage medium.

BACKGROUND

In the process of manufacturing a semiconductor device, there is a step of etching an oxide film, and plasma etching using a processing gas containing a CF-based gas is often used to etch the oxide film.

After plasma etching with the gas containing the CF-based gas, a CF-based deposit (a polymer layer) remains as etching residue in a pattern after etching.

As a method for removing such CF-based deposits, a method using plasma of a gas containing $O_2$ gas (e.g., Patent Document 1), a method using a chemical liquid such as hydrofluoric acid or sulfuric acid (e.g., Patent Document 2), and the like are known.

PRIOR ART DOCUMENTS

Patent Documents (Patent Document 1) Japanese Laid-Open Patent Publication No. H6-236864
(Patent Document 2) Japanese Laid-Open Patent Publication No. 2001-176855

The present disclosure provides a technique capable of removing a CF-based deposit remaining as an etching residue on a pattern after etching while suppressing damage to the pattern and pattern collapse.

SUMMARY

An etching method according to an aspect of the present disclosure includes a step of preparing a substrate having a portion to be etched, a step of plasma-etching the portion to be etched of the substrate into a predetermined pattern using plasma of a processing gas containing a CF-based gas, and, after that, a step of removing a CF-based deposit which remains as an etching residue. The step of removing the CF-based deposit includes a step of forming an oxide including an oxide of the CF-based deposit using an oxygen-containing radical and a step of removing the oxide including the oxide of the CF-based deposit by radical processing or chemical processing using gas.

According to the present disclosure, it is possible to remove a CF-based deposit remaining as an etching residue on a pattern after etching while suppressing damage to the pattern and pattern collapse.

BRIEF DESCRIPTION OF DRAWINGS

FIG. 1 is a flowchart illustrating an etching method according to a first embodiment.

FIG. 3 is a flowchart illustrating an etching method according to a second embodiment.

FIG. 4C is a schematic view illustrating a state of the wafer after oxide removal processing in the second embodiment.

FIG. 9B is a diagram showing results of scanning the vicinity of a C1s peak using XPS after oxidation processing.

FIG. 9C is a diagram showing results of scanning the vicinity of a C1s peak using XPS after oxide removal processing.

DETAILED DESCRIPTION

Figure 2A:
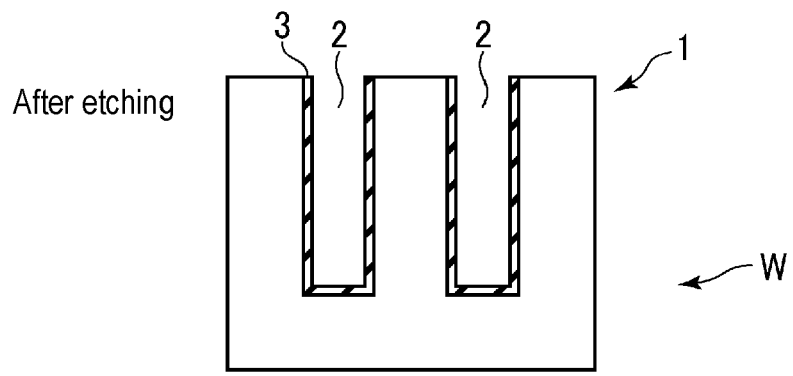
FIG. 2A is a schematic view illustrating a state of a wafer after plasma etching in the first embodiment.

Hereinafter, embodiments will be described with reference to the accompanying drawings.

<Background and Outline>
First, the background and outline of an etching method according to an embodiment of the present disclosure will be described.

In the process of manufacturing a semiconductor device, when an unetched film such as an oxide film is plasma-etched using a gas containing a CF-based gas, a CF-based deposit (a polymer layer) remains as an etching residue in a pattern after the etching.

In contrast, in Patent Document 1, a CF-based deposit is removed using plasma of a gas containing $O_2$ gas. However, since the plasma is generated in a chamber that accommodates a substrate to be processed, the pattern may be damaged by ions in the plasma.

In Patent Document 2, a CF-based deposit is removed through wet processing using a chemical liquid such as hydrofluoric acid or sulfuric acid. However, when a pattern becomes finer, there is concern that the risk of pattern collapse will increase due to the chemical solution.

Therefore, in one aspect, a step of preparing a substrate having a portion to be etched, a step of plasma-etching the portion to be etched of the substrate into a predetermined pattern using plasma of a processing gas containing a CF-based gas, and then a step of removing a CF-based deposit remaining as an etching residue are performed. Further, as processing for removing the CF-based deposit, a step of forming an oxide including an oxide of the CF-based deposit using oxygen-containing radicals and a step of removing the oxide including the oxide of the CF-based deposit through chemical processing using gas or radical processing are performed.

As described above, since the post-processing step of removing the CF-based deposit after the step of plasma-etching using plasma based on the processing gas containing the CF-based gas is dry processing, pattern collapse is suppressed. In addition, since this post-processing step is performed through radical processing and chemical processing using gas, or only through radical processing, ion damage to the pattern is suppressed.

First Embodiment

Next, a specific first embodiment will be described. FIG. 1 is a flowchart illustrating an etching method according to the first embodiment.

First, a substrate having a portion to be etched is prepared (step 1). The substrate is not particularly limited, but a semiconductor wafer represented by a silicon wafer (hereinafter, simply referred to as a "wafer") is described by way of example. In addition, as the portion to be etched, a silicon oxide film ($SiO_2$ film) is described by way of example. The $SiO_2$ film may be, for example, a thermal oxide film or a CVD film such as a TEOS film. The TEOS film is a CVD film using tetraethoxysilane (TEOS) as a Si precursor.

Next, the portion to be etched of the substrate is plasma-etched into a predetermined pattern using plasma of a processing gas containing a CF-based gas (step 2). A fine pattern is formed through this etching. The CF-based gas is a gas containing carbon (C) and fluorine (F), and may be either a gas composed only of C and F, such as $CF_4$, $C_4F_6$, or $C_4F_8$, or a gas composed of C, F, and H, such as $CH_2F_2$ or $CHF_3$. The processing gas may contain other gases, such as Ar gas, in addition to the CF-based gas. The etching step of step 2 may be performed through general plasma etching, and a capacitively coupled plasma-etching apparatus of a parallel plate type or a microwave plasma-etching apparatus may be used.

The fine pattern obtained by etching the portion to be etched through this plasma etching has a recess such as a trench or a hole, and after etching, a CF-based deposit (a CF polymer) remains on a side surface and a bottom surface of the recess as etching residue.

Therefore, after the etching, post-processing is performed to remove the CF-based deposit remaining as the etching residue (step 3).

In the post-processing step of this step 3, first, oxidation processing using oxygen-containing radicals is performed to form an oxide including an oxide of the CF-based deposit (step 3-1), and then the oxide including the oxide of the CF-based deposit is removed through radical processing or chemical processing using gas (step 3-2).

Figure 2B:
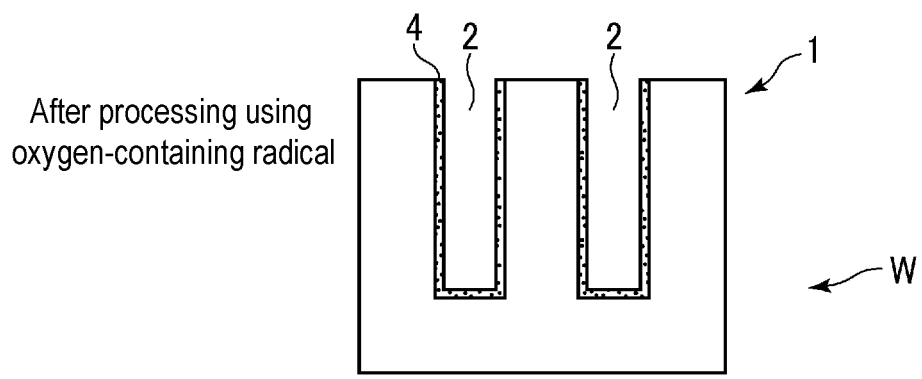
FIG. 2B is a schematic view illustrating a state of the wafer after processing using oxygen-containing radicals in the first embodiment.
Figure 2C:
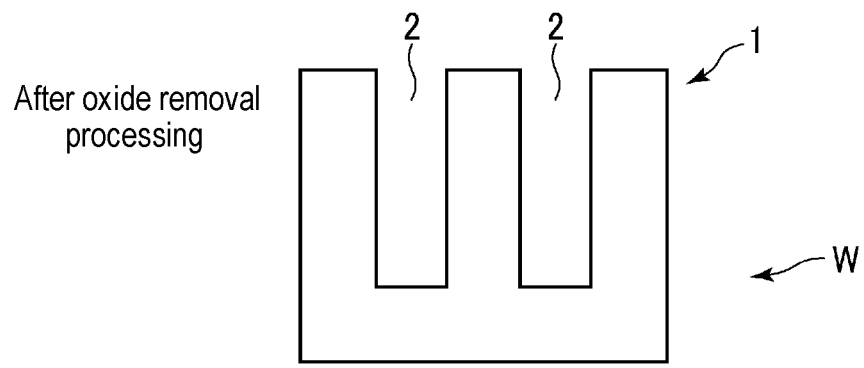
FIG. 2C is a schematic view illustrating a state of the wafer after oxide removal processing in the first embodiment.

In a wafer W as a substrate to be processed, when, for example, an oxide film is plasma-etched using a processing gas containing the CF-based gas, as illustrated in FIG. 2A, a CF-based deposit 3 is formed on the inner walls (side surfaces and bottom surfaces) of recesses 2 in an etched pattern 1. In the present embodiment, through the oxidation processing of step 3-1, an oxide 4 including the oxide of the CF-based deposit is formed, as illustrated in FIG. 2B, and through the oxide removal processing of step 3-2, the oxide 4 is removed, as illustrated in FIG. 2C.

The oxidation processing of the CF-based deposit in step 3-1 may be performed by generating oxygen-containing plasma and allowing mainly oxygen-containing radicals, typically $O_2$ radicals or O radicals, to act in the plasma. Such processing is preferably performed using remote plasma. The remote plasma is performed by generating oxygen-containing plasma in a plasma generation space separate from the processing space in which the substrate is disposed, and transporting the plasma to the processing space. In this case, ions such as oxygen ions ($O_2$ ions) in the oxygen-containing plasma are easily deactivated during transportation, and thus oxygen-containing radicals are mainly supplied to the processing space. It is possible to reduce damage to the pattern by performing radical-based processing. The plasma source in this case is not particularly limited, and inductively coupled plasma, microwave plasma or the like may be used.

$O_2$ gas is suitable as the gas used to generate the oxygen-containing plasma. $O_2$ gas may be used alone, but at least one of $H_2$ gas and a rare gas may be added to $O_2$ gas. By adding $H_2$ gas, the oxidizing ability can be enhanced. Further, by adding a rare gas, plasma can be stabilized. The rare gas is not particularly limited, but Ar gas is preferable. The pressure at this time is preferably in the range of 13.3 to 266.6 Pa (100 to 2,000 mTorr), and more preferably in the range of 26.6 to 133.3 Pa (200 to 1,000 mTorr). The substrate temperature at this time is preferably in the range of 0.1 to 120 degrees C., and more preferably in the range of 15 to 100 degrees C.

As an example of the chemical processing using a gas used in the processing for removing the oxide including the oxide of the CF-based deposit in step 3-2, chemical processing using a processing gas containing a fluorine-containing gas may be mentioned. Through this processing, the oxide including the CF-based deposit reacts with the processing gas to produce a compound that is removable through heating or the like.

The fluorine-containing gas contained in the processing gas may be, for example, hydrogen fluoride (HF) gas, and gases other than the fluorine-containing gas may be, for example, $H_2O$ gas and a reducing gas. The reducing gas may be, for example, ammonia ($NH_3$) gas or amine gas. By causing the fluorine-containing gas and $H_2O$ gas or a reducing gas to react with the oxide including the oxide of the CF-based deposit, it is possible to produce a compound that is relatively easily removable.

Among these, HF gas as the fluorine-containing gas and $NH_3$ gas as the reducing gas are preferably used. Using HF gas and $NH_3$ gas, chemical oxide removal (COR) processing, which has been conventionally known as oxide removal processing, may be performed. In COR processing, reaction processing in which HF gas and $NH_3$ gas are adsorbed on the surface of the oxide and are reacted with the oxide to produce an ammonium fluoride compound is performed, and then heating processing in which the ammonium fluoride compound is heated and sublimated is performed. The oxides formed on a silicon wafer are mainly silicon oxide ($SiO_2$), and an oxide of the CF-based deposit is present therein. In this case, HF, $NH_3$, and $SiO_2$ form a compound mainly composed of ammonium fluorosilicate.

The heating processing may be performed using an apparatus separate from the reaction processing, or the reaction processing and the heating processing may be repeated in the chamber in which the reaction processing is performed to sublimate the ammonium fluoride compound.

In such COR processing, the pressure is preferably in the range of 6.66 to 400 Pa (50 to 3,000 mTorr), and more preferably in the range of 13.3 to 266.6 Pa (100 to 2,000 mTorr). Further, the substrate temperature at this time is preferably in the range of 0.1 to 120 degrees C., and more preferably in the range of 20 to 100 degrees C.

The radical processing used for the processing of removing the oxide including the oxide of the CF-based deposit in step 3-2 may be performed using F radicals and N radicals formed by activating a processing gas containing $NF_3$ gas and $NH_3$ gas. This processing is preferably performed using remote plasma by generating plasma of a gas containing $NF_3$ gas and $NH_3$ gas in a plasma generation space separate from the processing space in which the substrate is disposed and transporting the plasma to the processing space. In addition to $NF_3$ gas and $NH_3$ gas, $H_2$ gas may be added.

The pressure at this time is preferably in the range of 13.3 to 200 Pa (100 to 1,500 mTorr), and more preferably in the range of 66.7 to 160 Pa (500 to 1,200 mTorr). Further, the substrate temperature is preferably in the range of 0.1 to 120 degrees C., and more preferably in the range of 15 to 100 degrees C. When step 3-2 is performed through this radical processing, the radical processing can also be performed in the same chamber as the oxidation processing of step 3-1.

Although the CF-based deposit may be removed through steps 3-1 and 3-2, steps 3-1 and 3-2 may be repeated in order to remove the CF-based deposit more completely.

According to the present embodiment, since the post-processing step of removing the CF-based deposit after the step of plasma etching using the processing gas containing the CF-based gas is dry processing, it is possible to prevent pattern collapse, which occurs in the case of wet processing. In addition, since this post-processing step is performed through radical processing and chemical processing using gas or only through radical processing, it is possible to suppress damage to the pattern caused by ions in the plasma.

Second Embodiment

Next, a specific second embodiment will be described. FIG. 3 is a flowchart illustrating an etching method according to the second embodiment.

First, as in step 1 of the first embodiment, a substrate having a portion to be etched is prepared (step 11). As in the first embodiment, the substrate is not particularly limited, and a semiconductor wafer represented by a silicon wafer (hereinafter, simply referred to as a "wafer") is described by way of example, and has a surface formed of a Si-containing portion, for example, Si or SiGe. In addition, as the portion to be etched, a silicon oxide film ($SiO_2$ film) is described by way of example.

Next, as in step 2 of the first embodiment, the portion to be etched of the substrate is plasma-etched into a predetermined pattern using plasma of a processing gas containing a CF-based gas (step 12). A fine pattern is formed through this etching.

The fine pattern obtained by etching the portion to be etched through this plasma etching has a recess such as a trench or a hole, and after etching, a CF-based deposit (a CF polymer) remains on a side surface and a bottom surface of the recess as an etching residue. During plasma etching, a damaged layer in which C and F are implanted into the Si-containing portion exposed in the bottom portion of the formed recess, for example, Si or SiGe, may be formed.

In the present embodiment, after plasma etching, post-processing is performed to remove the CF-based deposit and the damaged layer remaining as etching residue (step 13).

The thickness of the damaged layer varies depending on the conditions. When the damaged layer is present but has a small thickness, the damaged layer can be removed together with the CF-based deposit even through step 3 in the first embodiment in which the damaged layer is not considered. However, when the damaged layer is somewhat thicker, the damaged layer cannot be removed in step 3 of the first embodiment. More specifically, when the damaged layer is thicker, even if the oxidation processing using oxygen-containing radicals is performed in step 3-1, which is an initial step, the oxygen-containing radicals cannot sufficiently reach the damaged layer, and the oxidation of C and F in the damaged layer becomes insufficient. As a result, it becomes difficult to sufficiently remove the damaged layer even if the step of removing the oxide in step 3-2 is performed.

Therefore, in step 13 of this embodiment, first, fluorine-containing radicals are added in addition to oxygen-containing radicals to perform oxidation processing (step 13-1). As a result, since the surface of the damaged layer is etched by fluorine-containing radicals, it is possible for oxygen-containing radicals to infiltrate into the damaged layer and to oxidate and modify the damaged layer. Further, the oxide including the oxide of the CF-based deposit and the oxide of the damaged layer are removed through radical processing or chemical processing using gas (step 13-2).

Figure 4A:
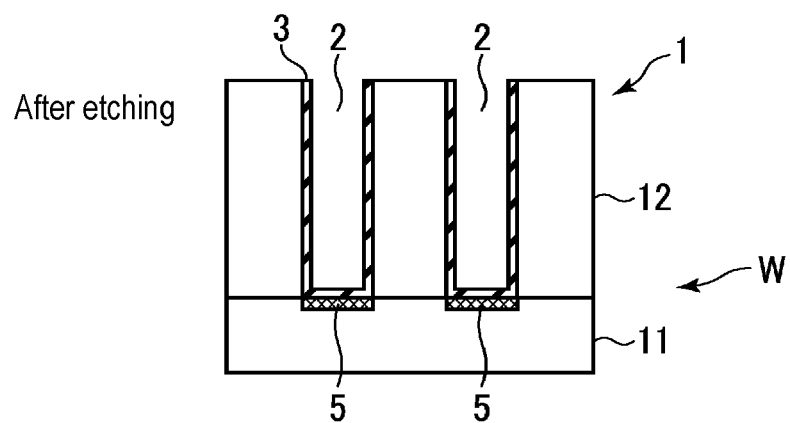
FIG. 4A is a schematic view illustrating a state of a wafer after plasma etching in the second embodiment.

More specifically, in this embodiment, a wafer W as a substrate to be processed has a structure in which, for example, an oxide film 12 is formed on the substrate 11, as illustrated in FIG. 4A. When the oxide film 12 is plasma-etched using the processing gas containing the CF-based gas to form recesses 2, a CF-based deposit 3 is formed on inner walls (side surfaces and bottom surfaces) of the recesses 2, and a damaged layer 5 in which C and F are implanted into an Si-containing portion on the surface of the substrate 11 exposed in the bottom portions of the recesses 2, for example, Si or SiGe, is formed.

Figure 4B:
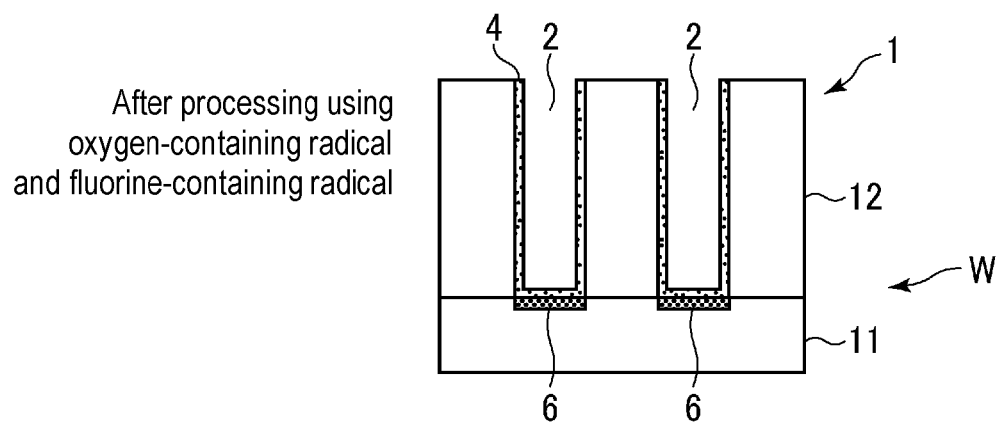
FIG. 4B is a schematic view illustrating a state of the wafer after processing using oxygen-containing radicals and fluorine-containing radicals in the second embodiment.

Next, through the processing using oxygen-containing radicals and fluorine-containing radicals in step 13-1, an oxide 4 including the oxide of the CF-based deposit is formed, and an oxide 6 of the damaged layer is formed, as illustrated in FIG. 4B. That is, since the damaged layer 5 is easily etched, the surface thereof is thinly etched by the fluorine-containing radicals. Thus, the oxygen-containing radicals sufficiently reach the inside of the damaged layer 5, and the damaged layer 5 is modified into the oxide 6.

Next, through the oxidation removal processing of step 13-2, the oxide 4 and the oxide 6 are removed, as illustrated in FIG. 4C.

The processing of step 13-1 may be performed by generating plasma containing oxygen and fluorine and causing oxygen-containing radicals and fluorine-containing radicals in the plasma to act. The oxygen-containing radicals in the plasma are typically $O_2$ radicals or O radicals, and the fluorine-containing radicals are typically F radicals. This processing is preferably performed using remote plasma, as in step 3-1 of the first embodiment. Using the remote plasma, it is possible to perform radical-based processing and to reduce damage to the pattern. The plasma source in this case is not particularly limited, and inductively coupled plasma, microwave plasma, or the like may be used, as in step 3-1.

An oxygen-containing gas and a fluorine-containing gas may be used as the gas used for plasma generation. $O_2$ gas is suitable as the oxygen-containing gas. As in the first embodiment, $H_2$ gas may be added to enhance the oxidizing ability. As the fluorine-containing gas, $NF_3$ gas, $SF_6$ gas, $F_2$ gas, or the like may be used. As in the first embodiment, a rare gas (e.g., Ar gas) may be added in order to stabilize plasma. The volume ratio of the fluorine-containing gas to the oxygen-containing gas during this processing (fluorine-containing gas/oxygen-containing gas) is preferably 1% (1 volume %) or less. Oxidation of the damaged layer or the like may proceed while thinly etching the damaged layer in this range.

The pressure in step 13-1 is preferably in the range of 13.3 to 266.6 Pa (100 to 2,000 mTorr), and more preferably in the range of 26.6 to 133.3 Pa (200 to 1,000 mTorr). A substrate temperature at this time is preferably in the range of 0.1 to 120 degrees C., and more preferably in the range of 15 to 100 degrees C.

The processing for removing the oxide including the oxide of the CF-based deposit and the oxide of the damaged layer in step 13-2 may be performed through radical processing or chemical processing using gas, and may be performed as in step 3-2 of the first embodiment.

Although the CF-based deposit and the damaged layer may be removed through steps 13-1 and 13-2, steps 13-1 and 13-2 may be repeatedly performed in order to remove the CF-based deposit and the damaged layer more completely.

According to this embodiment, it is possible to remove the CF-based deposit with the effect of preventing pattern collapse and pattern damage caused by the ions in the plasma, as in the first embodiment, and to remove the damaged layer together with the CF-based deposit.

<Exemplary Processing System>

Figure 5:
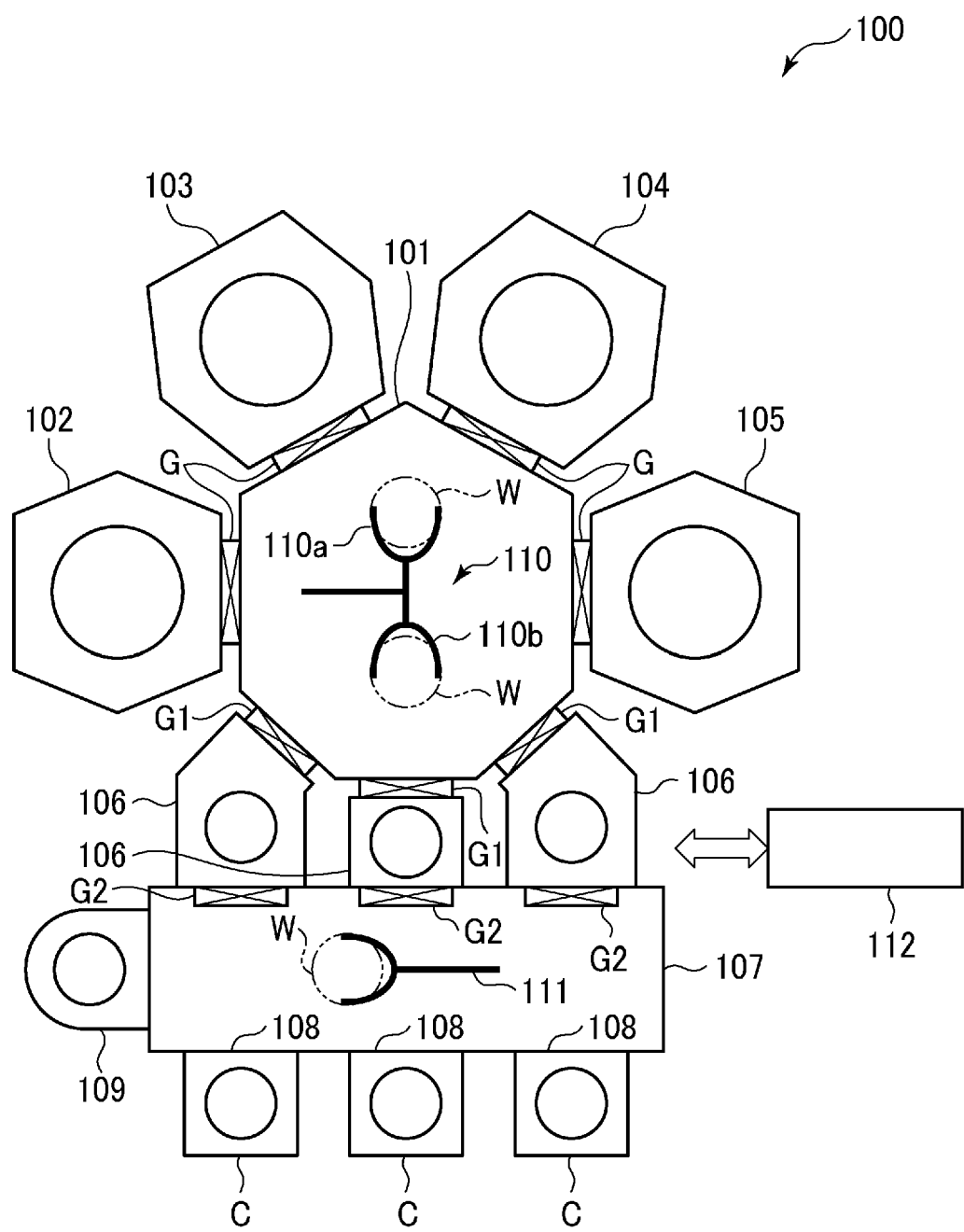
FIG. 5 is a horizontal cross-sectional view schematically illustrating an exemplary processing system used in an etching method of an embodiment.

Next, an exemplary processing system used for the etching methods of the first and second embodiments will be described. FIG. 5 is a horizontal cross-sectional view schematically illustrating the exemplary processing system.

As illustrated in FIG. 5, the processing system 100 of this example has a vacuum transport chamber 101 having a heptagonal shape in a plan view. As processing apparatuses, a plasma-etching apparatus 102, an oxidation-processing apparatus 103, an oxide removal apparatus 104, and a heating apparatus 105 are respectively connected to four walls of the vacuum transport chamber 101 via gate valves G. The inside of the vacuum transport chamber 101 is evacuated by a vacuum pump, and is maintained at a predetermined degree of vacuum.

In addition, three load-lock chambers 106 are respectively connected to the other three walls of the vacuum transport chamber 101 via gate valves G1. The load-lock chambers 106 perform pressure control between atmospheric pressure and vacuum when the wafer W is transported between an atmospheric transport chamber 107 and the vacuum transport chamber 101. The atmospheric transport chamber 107 is provided on the side opposite the vacuum transport chamber 101, with the load-lock chambers 106 interposed therebetween. The three load-lock chambers 106 are connected to the atmospheric transport chamber 107 via gate valves G2, respectively.

The wall of the atmospheric transport chamber 107, opposite the wall on which the load-lock chambers 106 are mounted, includes three carrier-mounting ports 108 in each of which a carrier (e.g., a FOUP) C for accommodating the wafers W each having a portion to be etched is installed. In addition, on a side wall of the atmospheric transport chamber 107, an alignment chamber 109 is provided to perform alignment of a silicon wafer W. The atmospheric transport chamber 107 is configured to form a downflow of clean air therein.

In the vacuum transport chamber 101, a wafer transport mechanism 110 is provided. The wafer transport mechanism 110 transports the wafer W to the plasma-etching apparatus 102, the oxidation-processing apparatus 103, the oxide removal apparatus 104, the heating apparatus 105, and the load-lock chambers 106. The wafer transport mechanism 110 has two independently movable transport arms 110a and 110b.

In the atmospheric transport chamber 107, a wafer transport mechanism 111 is provided. The wafer transport mechanism 111 transports the silicon wafer W to the carriers C, the load-lock chambers 106, and the alignment chamber 109.

The processing system 100 has an overall controller 112. The overall controller 112 includes a main controller having a CPU that controls the operation of each component of the processing system 100, such as the vacuum transport chamber, each of the load-lock chambers, and the like, an input device, an output device, a display device, and a storage device (a storage medium). The main controller causes each component of the processing system 100 to perform the above-described etching method based on, for example, a processing recipe stored in a non-transitory storage medium built in the storage device or a non-transitory storage medium set in the storage device.

In the processing system 100 configured as described above, first, a wafer W is taken out from a carrier C connected to the atmospheric transport chamber 107 by the transport mechanism 111, and after passing through the alignment chamber 109, the gate valve G2 of any load-lock chamber 106 is opened, and the wafer W is loaded into the load-lock chamber 106. After closing the gate G2, the inside of the load-lock chamber 106 is evacuated, and when the load-lock chamber 106 reaches a predetermined degree of vacuum, the gate valve G1 is opened, and the wafer W is taken out from the load-lock chamber 106 by any of the transport arms 110a and 110b of the transport mechanism 110.

Further, the wafer W held by the transport arm is loaded into the plasma-etching apparatus 102, and the portion to be etched of the wafer W is plasma-etched using a processing gas containing a CF-based gas by the plasma-etching apparatus 102.

Next, after the plasma etching is completed, the wafer W is unloaded out of the plasma-etching apparatus 102 by the transport arm and is loaded into the oxidation-processing apparatus 103. Then, oxidation processing is performed by the oxidation-processing apparatus 103 to form an oxide including an oxide of the CF-based deposit.

Next, after the oxidation processing, the wafer W is unloaded out of the oxidation-processing apparatus 103 by the transport arm and is loaded into the oxide removal apparatus 104. Then, the oxide including the oxide of the CF-based deposit is removed by the oxide removal apparatus 104.

When the oxide removal processing is COR removal processing using HF gas and $NH_3$ gas, an ammonium fluoride compound is generated after the processing. Thus, the wafer W processed in the oxide removal apparatus 104 is loaded into the heating apparatus 105 so as to remove a reaction product through heating.

After the plasma-etching processing, the oxidation processing, and the oxide removal processing are performed in this way, the processed wafer W is transported to any of the load-lock chambers 106 by the transport arm. Then, the inside of the load lock chamber 106 is returned to atmospheric pressure, and the wafer W in the load-lock chamber 106 is returned to the carrier C by the transport mechanism 111.

The processing described above is performed on a plurality of wafers W in a simultaneous and parallel manner so that the etching processing is completed on a predetermined number of wafers W.

<Plasma-Etching Apparatus>

Any apparatus may be used as the plasma-etching apparatus 102 mounted on the processing system 100, as long as the apparatus is capable of performing general plasma etching, and a capacitively coupled plasma etching apparatus of a parallel plate type and a microwave plasma-etching apparatus are described by way of example. At the time of plasma etching, a processing gas containing the CF-based gas is ionized, and the portion to be etched such as an oxide film is anisotropically etched by the ions.

<Oxidation-Processing Apparatus>

Next, an exemplary oxidation-processing apparatus 103 mounted on the processing system 100 will be described.

Figure 6:
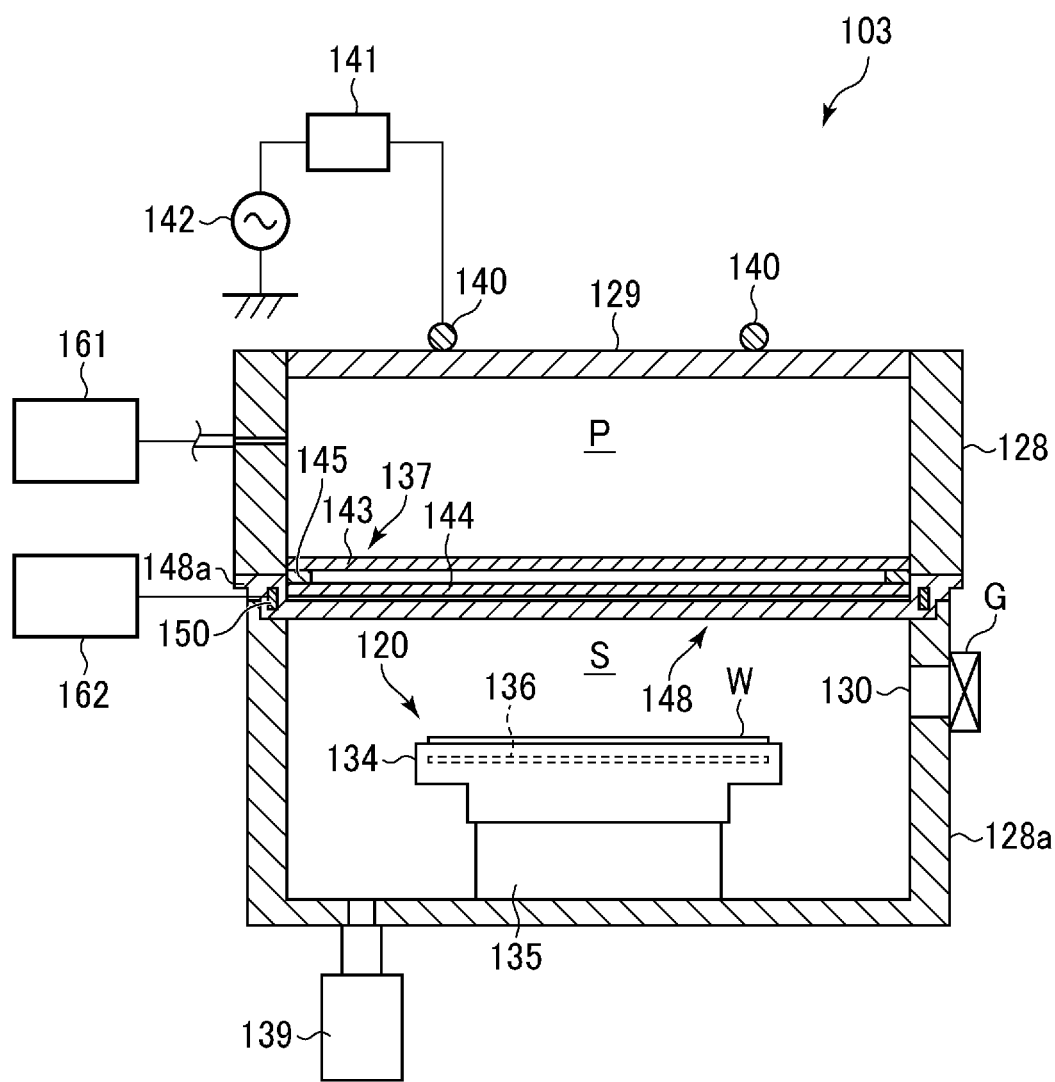
FIG. 6 is a cross-sectional view schematically illustrating an exemplary oxidation-processing apparatus mounted in the processing system of FIG. 5.

FIG. 6 is a cross-sectional view illustrating an exemplary oxidation-processing apparatus. The oxidation-processing apparatus 103 performs step 3-1 of the first embodiment and step 13-1 of the second embodiment. As illustrated in FIG. 6, the oxidation-processing apparatus 103 includes a processing container 128 having a closed structure for accommodating the wafer W. The processing container 128 is made of, for example, aluminum or an aluminum alloy, and the upper end thereof is opened and closed by a lid 129 serving as a ceiling part. The side wall 128a of the processing container 128 is provided with a loading/unloading port 130, through which a wafer W is loaded into/unloaded out of the vacuum transport chamber 101, and the loading/unloading port 130 is configured to be capable of being opened and closed by the above-mentioned gate valve G.

In addition, on a bottom portion inside the processing container 128, a stage 120 on which the wafer W is placed in a horizontal state is disposed. The stage 120 has a substantially cylindrical shape, and includes a placement plate 134 on which the wafer W is directly mounted, and a base block 135, which supports the placement plate 134. Inside the placement plate 134, a temperature adjustment mechanism 136 is provided so as to adjust the temperature of the wafer W. The temperature adjustment mechanism 136 has, for example, a pipeline (not illustrated) through which a temperature adjustment medium (e.g., water or Galden) circulates, and heat exchange occurs between the temperature adjustment medium flowing in the pipeline and the wafer W, thereby adjusting the temperature of the wafer W. The stage 120 is provided with a plurality of lifting pins (not illustrated), which are capable of being protruded and retracted with respect to the top surface of the placement plate 134 when the wafer W is loaded into/unloaded out of the processing container 128.

The inside of the processing container 128 is partitioned by a partition plate 137 into an upper plasma generation space P and a lower processing space S. The partition plate 137 has a plate-shaped member 143 and a plate-shaped member 144 provided with slits that do not overlap each other when the partition plate 137 is viewed from the processing space S. Accordingly, the partition plate 137 functions as a so-called ion trap that suppresses transmission of ions in the plasma from the plasma generation space P to the processing space S when inductively coupled plasma is generated in the plasma generation space P. The plasma generation space P is a space in which plasma is generated, and the processing space S is a space in which the wafer W is etched by radical processing. Outside the processing container 128, a first gas supply part 161 configured to supply a processing gas used for oxidation processing to the plasma generation space P, and a second gas supply part 162 configured to supply, to the processing space S, a non-plasmarized gas such as a pressure-adjustment gas, a purge gas, or a dilution gas, for example, an inert gas, such as $N_2$ gas or Ar gas, are provided. An exhaust mechanism 139 is connected to the bottom portion of the processing container 128. The exhaust mechanism 139 has a vacuum pump, and evacuates the inside of the processing space S.

A heat shield plate 148 is provided under the partition plate 137 so as to face the wafer W. The heat shield plate 148 is provided to suppress the heat, which is accumulated in the partition plate 137 by repeating plasma generation in the plasma generation space P, from affecting the radical distribution in the processing space S. The heat shield plate 148 is formed to be larger than the plate-shaped member 144 of the partition plate 137, and a flange portion 148a forming a peripheral edge portion is embedded in the side wall 128a of the processing container 128. A cooling mechanism 150 (e.g., a coolant channel, a chiller, or a Peltier element) is embedded in the flange portion 148a.

When performing step 3-1 of the first embodiment, the first gas supply part 161 supplies $O_2$ gas as the oxygen-containing gas to the plasma generation space P, or supplies $H_2$ gas and a rare gas (e.g., Ar gas) to the plasma generation space P in addition to $O_2$ gas. These gases are plasmarized in the plasma generation space P so as to generate oxygen-containing plasma. The rare gas functions as a plasma generation gas, but also functions as a pressure adjustment gas, a purge gas, and the like.

In addition, when step 13-1 of the second embodiment is performed, the first gas supply part 161 supplies $NF_3$ gas, $SF_6$ gas, or $F_2$ gas into the plasma generation space P as the fluorine-containing gas, in addition to $O_2$ gas or the like. As a result, plasma containing oxygen and fluorine is generated.

The oxidation-processing apparatus 103 is configured as an inductively coupled plasma-etching apparatus using an RF antenna. The lid 129, which is the ceiling of the processing container 128, is formed of, for example, a circular quartz plate, and is configured as a dielectric window. An annular RF antenna 140 configured to generate inductively coupled plasma in the plasma generation space P of the processing container 128 is disposed on the lid 129, and the RF antenna 140 is connected to a high-frequency power supply 142 via a matcher 141. The high-frequency power supply 142 outputs high-frequency power having a predetermined frequency (e.g., 13.56 MHz or more) suitable for generating plasma through inductively coupled high-frequency discharge at a predetermined output value. The matcher 141 includes a reactance-variable matching circuit (not illustrated) for matching the impedance on the high-frequency power supply 142 side with the impedance on the load (RF antenna 140 or plasma) side.

In the oxidation-processing apparatus 103 configured in this way, the wafer W is loaded into the processing container 128 and is placed on the stage 120.

Next, $N_2$ gas, for example, is introduced into the processing container 128 as the pressure adjustment gas from the second gas supply part 162, and the wafer W is held on the stage 120, the temperature of which is adjusted to 0.1 to 120 degrees C. by the temperature adjustment mechanism 136 for a predetermined time while adjusting the pressure, thereby stabilizing the temperature of the wafer to a predetermined temperature.

Next, after purging the inside of the processing container 128, the pressure inside the processing container 128 is set to preferably 13.3 to 266.6 Pa (100 to 2,000 mTorr), and more preferably 26.6 to 133.3 Pa (200 to 1,000 mTorr). The temperature of the stage 120 is set to preferably 15 to 100 degrees C.

When the oxidation processing of step 3-1 of the first embodiment is performed, $O_2$ gas is supplied from the first gas supply part 161 to the plasma generation space P, and high-frequency power is supplied to the RF antenna 140, thereby generating oxygen-containing plasma ($O_2$ plasma), which is inductively coupled plasma. At this time, in addition to the $O_2$ gas, $H_2$ gas and at least one rare gas such as Ar gas may be supplied. The gas flow rates at this time are as follows: the flow rate of $O_2$ gas is preferably 50 to 500 sccm, the flow rate of $H_2$ gas is preferably 50 to 500 sccm, the flow rate of rare gas (Ar gas) is preferably 50 to 500 sccm, and the plasma generation power is preferably 100 to 1,000 W. The processing time is, for example, 30 to 180 sec.

The oxygen-containing plasma ($O_2$ plasma) generated in the plasma generation space P is transported to the processing space S. At this time, ions such as $O_2$ ions are deactivated by the partition plate 137, and mainly O radicals and $O_2$ radicals in the plasma are selectively introduced into the processing space S. With these radicals, oxidation processing is performed on the wafer W, and the oxide including the oxide of the CF-based deposit is formed on the inner wall of the pattern recess.

When the oxidation processing of step 13-1 of the second embodiment is performed, $O_2$ gas as the oxygen-containing gas and $NF_3$ gas as the fluorine-containing gas are supplied from the first gas supply part 161 to the plasma generation space P, and high-frequency power is supplied to the RF antenna 140, thereby generating oxygen- and fluorine-containing plasma, which is inductively coupled plasma. At this time, the fluorine-containing gas may be $SF_6$ gas, $F_2$ gas, or the like. Further, in addition to $O_2$ gas or $NF_3$ gas, $H_2$ gas and at least one rare gas such as Ar gas may be supplied. The gas flow rates at this time are, for example, as follows: the flow rate of $O_2$ is preferably 100 to 2,500 sccm, the flow rate of $NF_3$ gas is preferably 1 to 20 sccm, and the volume ratio (flow rate ratio) of $NF_3$ gas to $O_2$ gas ($NF_3/O_2$) is preferably 1% (1 volume %) or less. In addition, the plasma generation power is preferably 100 to 1,000 W. The processing time is, for example, 30 to 180 sec.

The oxygen- and fluorine-containing plasma generated in the plasma generation space P is transported to the processing space S. At this time, ions are deactivated in the partition plate 137, and mainly O radicals, $O_2$ radicals, and F radicals in the plasma are selectively introduced into the processing space S. At this time, the surface of the damaged layer existing on the bottom portions of the recesses is etched by F radical, and the CF-based deposit on the inner walls of the pattern recess and the damaged layer on the bottom portion of the recess are oxidized by O radical and $O_2$ radical, whereby oxides thereof are formed.

<Oxide Removal Apparatus>

Next, an exemplary oxide removal apparatus 104 mounted on the processing system 100 will be described. In this example, an apparatus that performs COR processing as oxide removal processing will be described.

Figure 7:
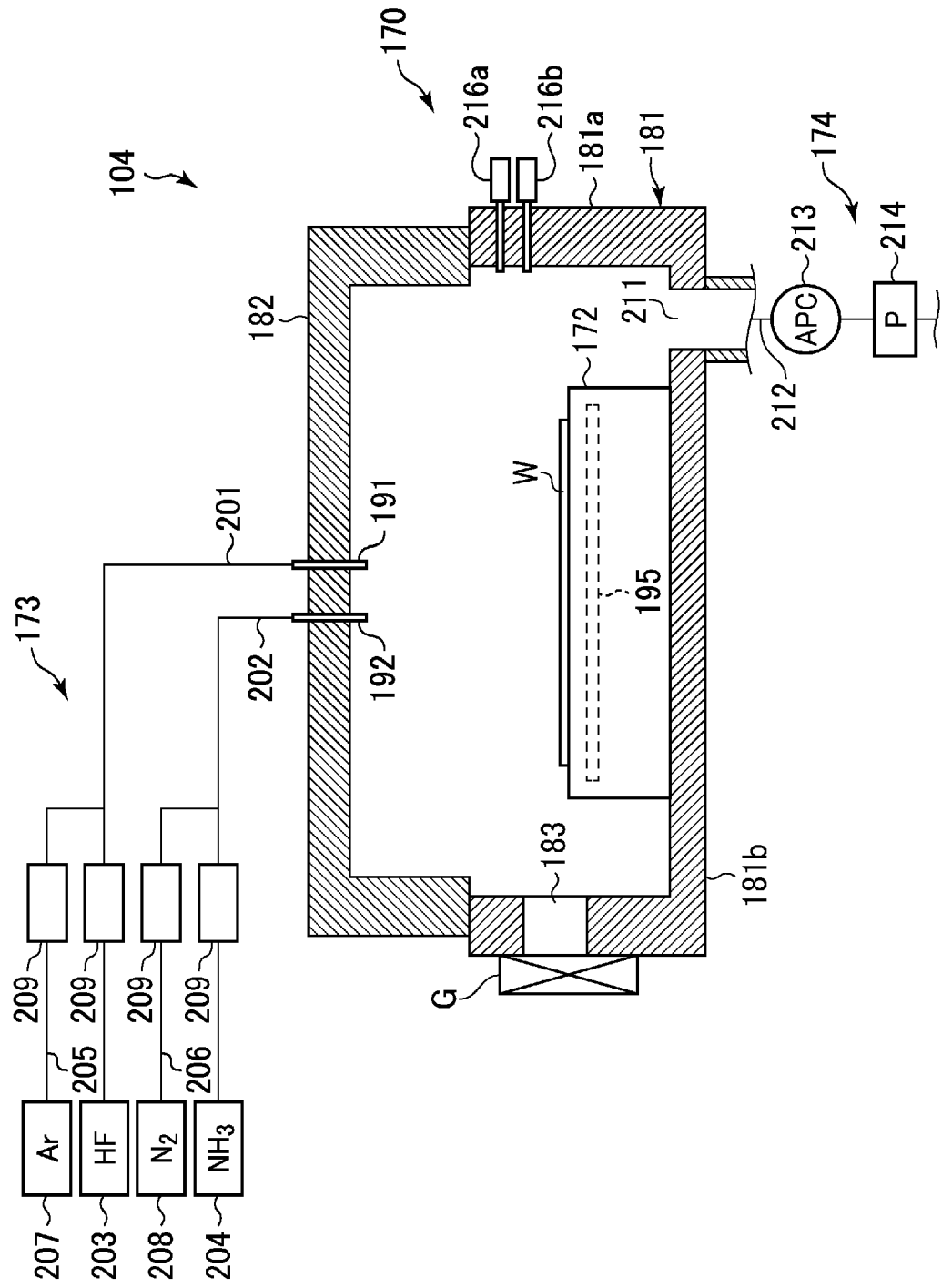
FIG. 7 is a cross-sectional view schematically illustrating an exemplary oxide removal apparatus mounted in the processing system of FIG. 5.

FIG. 7 is a cross-sectional view illustrating a COR apparatus as an exemplary oxide removal apparatus. As illustrated in FIG. 7, the oxide removal apparatus 104 includes a chamber 170 having a sealed structure and serving as a processing container that defines a processing space, and a stage 172, on which a wafer W is placed in a substantially horizontal state, is provided inside the chamber 170. The oxide removal apparatus 104 further includes a gas supply part 173 configured to supply an etching gas into the chamber 170 and an exhaust part 174 configured to evacuate the inside of the chamber 170.

The chamber 170 is constituted with a chamber body 181 and a lid 182. The chamber body 181 has a substantially cylindrical side wall 181a and a bottom portion 181b, and has, in an upper portion thereof, an opening that is closed by the lid 182. The side wall 181a and the lid 182 are sealed by a sealing member (not illustrated) to ensure the airtightness of the inside of the chamber 170. A first gas inlet nozzle 191 and a second gas inlet nozzle 192 are inserted into the ceiling wall of the lid 182 to face the inside of the chamber 170 from above.

The side wall 181a is provided with a loading/unloading port 183 through which the wafer W is loaded into/unloaded out of the vacuum transport chamber 101, and the loading/unloading port 183 is configured to be capable of being opened and closed by a gate valve G.

The stage 172 has a substantially circular shape in a plan view, and is fixed to the bottom portion 181b of the chamber 170. A temperature adjuster 195 is provided inside the stage 172 so as to adjust the temperature of the stage 172. The temperature adjuster 195 includes, for example, a pipeline through which a temperature adjustment medium (e.g., water) circulates, and heat exchange is performed with the temperature adjustment medium flowing in the pipeline, whereby the temperature of the stage 172 is adjusted so that the temperature of the wafer W on the stage 172 is controlled.

The gas supply part 173 has a first gas supply pipe 201 and a second gas supply pipe 202, which are connected to the first gas inlet nozzle 191 and the second gas inlet nozzle 192 described above, respectively, and has a HF gas supply source 203 and an $NH_3$ gas supply source 204 connected to the first gas supply pipe 201 and the second gas supply pipe 202, respectively. Further, a third gas supply pipe 205 is connected to the first gas supply pipe 201, and a fourth gas supply pipe 206 is connected to the second gas supply pipe 202. An Ar gas supply source 207 and a $N_2$ gas supply source 208 are connected to the third gas supply pipe 205 and the fourth gas supply pipe 206, respectively. Each of the first to fourth pipes 201, 202, 205, and 206 is provided with a flow rate controller 209 configured to perform an operation of opening/closing a flow path and flow rate control. The flow rate controller 209 is constituted with, for example, an opening/closing valve and a mass flow controller.

Further, HF gas and Ar gas are supplied into the chamber 170 via the first gas supply pipe 201 and the first gas inlet nozzle 191, and $NH_3$ gas and $N_2$ gas are supplied into the chamber 170 via the second gas supply pipe 202 and the second gas inlet nozzle 192.

Among the above-mentioned gases, HF gas and $NH_3$ gas are reaction gases, which are separately ejected into the chamber 170 from the first gas inlet nozzle 191 and the second gas inlet nozzle 192, respectively, and mixed for the first time in the chamber 170. Ar gas and $N_2$ gas are dilution gases. Further, HF gas and $NH_3$ gas, which are the reaction gases, and Ar gas and $N_2$ gas, which are the dilution gases, are introduced into the chamber 170 so as to cause HF gas and $NH_3$ gas to react with an oxide, thereby generating an ammonium fluoride compound as a reaction product. As the dilution gas, only Ar gas or only $N_2$ gas may be used, another inert gas may be used, or two or more of Ar gas, $N_2$ gas, and the other inert gas may be used.

In addition, a shower plate may be provided in the upper portion of the chamber 170, and an excited gas may be supplied in the form of a shower through the shower plate.

The exhaust part 174 includes an exhaust pipe 212 connected to an exhaust port 211 formed in a bottom portion 181b of the chamber 170. The exhaust part 174 includes an automatic pressure control valve (APC) 213 provided in the exhaust pipe 212 to control the pressure in the chamber 170 and a vacuum pump 214 configured to evacuate the inside of the chamber 170.

Two capacitance manometers 216a and 216b, one for high pressure and one for low pressure, are provided on the side wall of the chamber 170 as pressure gauges for measuring the pressure in the chamber 170 so as to be inserted into the chamber 170. In the vicinity of the wafer W placed on the stage 172, a temperature sensor (not illustrated) is provided to detect the temperature of the wafer W.

In the oxide removal apparatus 104 configured in this way, the wafer W is loaded into the chamber 170 and is placed on the stage 172. The pressure in the chamber 170 is set to be preferably in the range of 6.66 to 400 Pa (50 to 3,000 mTorr), and more preferably in the range of 13.3 to 266.6 Pa (100 to 2,000 mTorr). In addition, the temperature of the wafer W is set to be preferably 0.1 to 120 degrees C., and more preferably 20 to 100 degrees C. by the temperature adjuster 195 of the stage 172.

Next, the gas supply mechanism 173 supplies HF gas and $NH_3$ gas into the chamber 170 in a state of being diluted with Ar gas and $N_2$ gas, respectively. Any one of the Ar gas and $N_2$ gas, which are dilution gases, may be used. The flow rates of the gases at this time are as follows: the flow rate of HF gas is preferably 50 to 500 sccm, the flow rate of $NH_3$ gas is preferably 50 to 500 sccm, the flow rate of Ar gas is preferably 100 to 600 sccm, and the flow rate of $N_2$ is preferably 100 to 600 sccm.

As a result, HF gas and $NH_3$ gas are adsorbed on a wafer W, and the gases react with the oxide including the oxide of the CF-based deposit existing in the recess of the pattern, or the oxide of the damaged layer and the oxide including the oxide of the CF-based deposit, thereby generating ammonium fluoride compound.

Since it is possible to sublimate and remove the ammonium fluoride compound, which is a reaction product, using heat, it is possible to remove the ammonium fluoride compound using the heating apparatus 105. However, the ammonium fluoride compound may be sublimated by repeating the reaction processing and the heating processing in the chamber 170 of the oxide removal apparatus 104 of this example.

As another example of the oxide removal apparatus 104, a radical-processing apparatus that performs oxide removal processing using F radicals and N radicals formed by activating a processing gas containing $NF_3$ gas and $NH_3$ gas may be mentioned. As this apparatus, an apparatus that has the same configuration as the oxidation-processing apparatus 103 illustrated in FIG. 6 and replaces the gas supplied from the first gas supply part 161 with a processing gas containing $NF_3$ gas and $NH_3$ gas may be used. In addition, when an apparatus having the configuration of the oxidation-processing apparatus 103 is configured to supply a gas for oxidation processing and a gas for oxide removal processing from the first gas supply part 161, it is possible to implement an apparatus that is capable of performing both oxidation processing and oxide removal processing in a single processing container.

<Heating Apparatus>

As the heating apparatus 105 mounted on the processing system 100, it is possible to use an apparatus having a general configuration. For example, similar to the oxide removal apparatus 104 configured as the COR apparatus illustrated in FIG. 4, an apparatus including a chamber, a stage on which a wafer is placed in the chamber, a temperature control mechanism configured to heat the stage to a predetermined temperature, and a gas supply mechanism configured to supply a processing gas for heat treatment may be used. As the processing gas, an inert gas such as $N_2$ gas may be used.

In the above-described example, an example in which plasma-etching processing, oxidation processing, oxide removal processing, and the like is performed in situ by the processing system 100 has been illustrated, but each of a plasma-etching apparatus, an oxidation-processing apparatus, an oxide removal apparatus, and the like may be used alone. In addition, by using, as the processing system, a system including an oxidation-processing apparatus, an oxide removal apparatus, and a heating apparatus, it may be possible to perform oxidation processing and oxide removal processing on a wafer after plasma etching.

TEST EXAMPLE

Next, test examples will be described.

Test Example 1

Here, plasma-etching processing, radical oxidation processing, and oxide removal processing were performed on a sample in which a 100-nm-thick thermal oxide film was formed on a bare silicon wafer on which no pattern was formed, and XPS analysis was performed on the surface after each processing. The conditions for each processing were as follows.

Figure 8A:
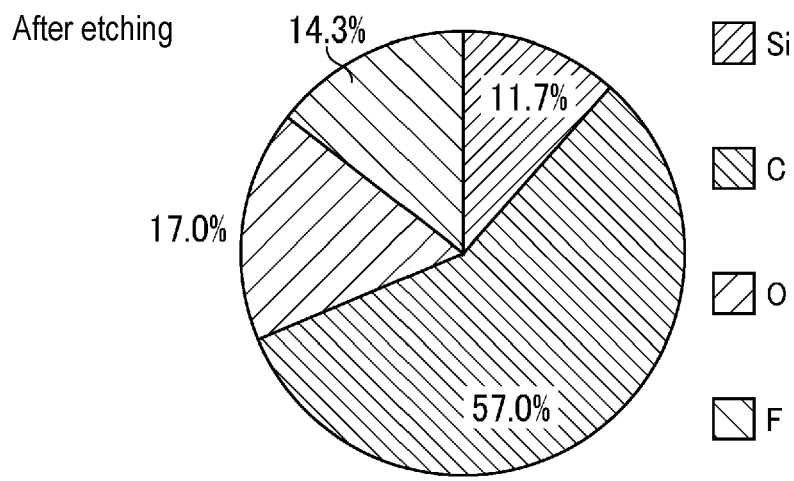
FIG. 8A is a diagram showing results of elemental analysis of a surface using XPS after plasma-etching processing.
Figure 8B:
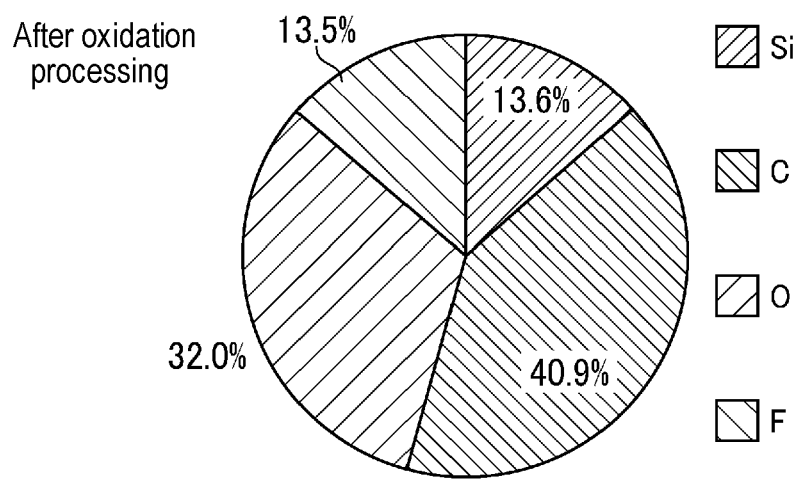
FIG. 8B is a diagram showing results of elemental analysis of a surface using XPS after oxidation processing.
Figure 8C:
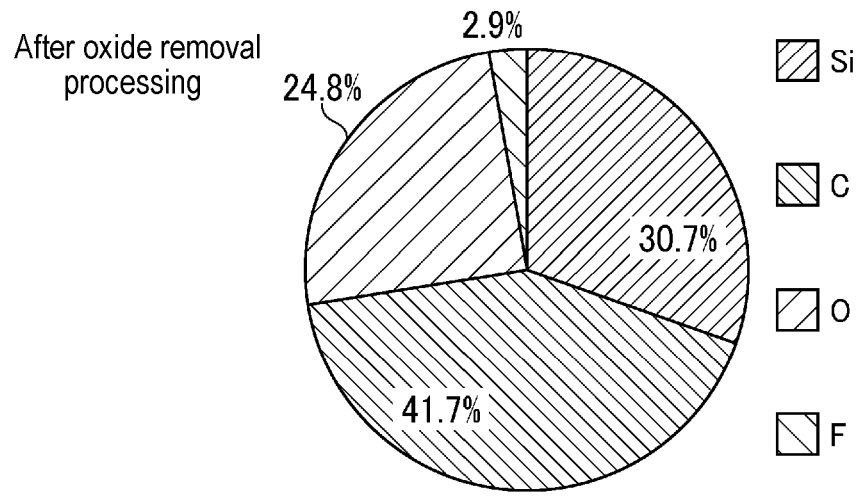
FIG. 8C is a diagram showing results of elemental analysis of a surface using XPS after oxide removal processing.

(Plasma-Etching Processing)
  Apparatus: Parallel plate type
  Pressure: 1.33 to 13.3 Pa (10 to 100 mTorr)
  Gas: $C_4F_6$: 10 to 50 sccm
    $CF_4$: 50 to 200 sccm
    Ar: 300 to 600 sccm
  High-frequency power: Upper portion—200 to 700 W
    Lower portion—2,000 to 3,000 W
  Etching: Full etching (Oxidation Processing)
  Apparatus: Oxidation-processing apparatus illustrated in FIGS. 4A to 4C
  Pressure: 40 to 93.3 Pa (300 to 700 mTorr)
  Temperature: 60 to 100 degrees C.
  Gas: $O_2$: 200 to 500 sccm
    Ar: 50 to 200 sccm
  High-frequency power: 300 to 800 W
  Time: 100 to 150 sec (Oxide Removal Processing)
  Apparatus: COR apparatus illustrated in FIG. 5
  Pressure: 40 to 93.3 Pa (300 to 700 mTorr)
  Temperature: 60 to 100 degrees C.
  Gas: HF: 100 to 200 sccm
    $NH_3$: 100 to 200 sccm
    Ar: 100 to 300 sccm
  Time: 120 to 500 sec FIGS. 8A to 8C are diagrams showing results of elemental analysis of a surface using XPS after completion of each processing. As shown in FIG. 8B, it can be seen that O is increased by the radical oxidation processing, and that O and F are decreased by the subsequent oxide removal processing (COR processing).

Figure 9A:
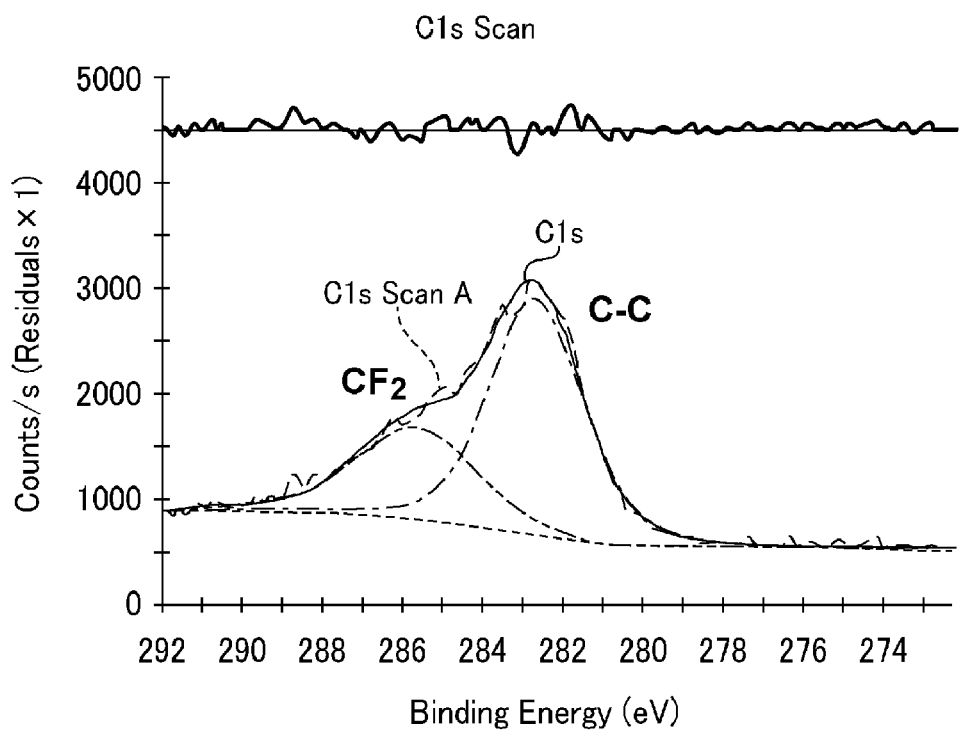
FIG. 9A is a diagram showing results of scanning the vicinity of a C1s peak using XPS after plasma-etching processing.

FIGS. 9A to 9C are diagrams showing results of scanning the vicinity of a C1s peak by XPS after completion of each processing. As shown in FIG. 9A, a $CF_2$ peak is detected after plasma etching, and it is confirmed that a CF-based deposit (a CF polymer) has been generated by plasma etching. In addition, as shown in FIG. 9B, since a peak of C=O bond is observed after oxidation processing, it can be seen that the CF-based deposit has been oxidated. In addition, as shown in FIG. 9C, since the $CF_2$ peak is lowered after oxide removal processing, it can be seen that the CF-based deposit has been removed. Since the $CF_2$ peak remains, the CF-based deposit has not been completely removed. However, it is possible to completely remove the CF-based deposit by tuning the conditions or repeating the oxidation processing and the oxide removal processing.

Test Example 2

Here, a pattern of recesses having an aspect ratio of 40 to 70 was formed by performing plasma-etching processing on an oxide film formed on silicon under the same conditions as in Test Example 1. At this time, it was confirmed that a CF polymer remained on the walls of the recesses and that a damaged layer was formed on the bottom portions of the recesses.

Next, oxidation processing was performed under the following conditions.

Apparatus: Oxidation-processing apparatus illustrated in FIG. 4
Pressure: 6.7 to 93.3 Pa (50 to 700 mTorr)
Temperature: 15 to 100 degrees C.
Gas: $O_2$: 100 to 2500 sccm
$NF_3$: 1 to 20 sccm
Ar: 50 to 200 sccm
$NF_3/O_2$: 0.2 to 1.0 volume %
High-frequency power: 100 to 1,000 W
Time: 100 to 150 sec Thereafter, oxide removal processing was performed under the same conditions as in Test Example 1.

As a result, it was confirmed that the CF polymer residues on the walls of the recesses and the damaged layers on the bottom portions of the recesses were almost completely removed.

<Other Applications>

Although the embodiments have been described above, it should be considered that the embodiments disclosed herein are examples in all respects and are not restrictive. The above-described embodiments may be omitted, replaced, or modified in various forms without departing from the scope and spirit of the appended claims.

For example, the apparatuses in the above-described embodiments are merely examples, and apparatuses having various configurations may be used. The case where a semiconductor wafer is used as the substrate to be processed has been described, but the substrate is not limited to the semiconductor wafer. The substrate may be another substrate such as a flat panel display (FPD) substrate represented by a liquid crystal display (LCD) substrate or a ceramic substrate.

EXPLANATION OF REFERENCE NUMERALS

1: pattern, 2: recess, 3: CF-based deposit, 4: oxide including oxide of CF-based deposit, 5: damaged layer, 6: oxide of damaged layer, 100: processing system, 102: plasma-etching apparatus, 103: oxidation-processing apparatus, 104: oxide removal apparatus, 105: heating apparatus, W: semiconductor wafer (substrate)

What is claimed is:

1. An etching method comprising:
preparing a substrate having a portion to be etched;
plasma-etching the portion to be etched of the substrate into a predetermined pattern using plasma of a processing gas containing a CF-based gas;
forming an oxide of an etching residue, which is a CF-based deposit generated during the plasma-etching, and an oxide of a damaged layer, which is formed at a bottom portion of the pattern by the plasma-etching, by supplying fluorine-containing radicals to remove a surface of the damaged layer and supplying oxygen-containing radicals to form the oxide of the etching residue and the oxide of the damaged layer; and
removing the oxide of the etching residue and the oxide of the damaged layer by radical processing or chemical processing using gas.

2. The etching method of claim 1, wherein the portion to be etched is a silicon oxide film.

3. The etching method of claim 1, wherein the forming the oxide is performed using plasma generated by $O_2$ gas alone or by $O_2$ gas and at least one of $H_2$ gas and a rare gas.

4. The etching method of claim 1, wherein the portion to be etched is formed on a silicon-containing portion, and the damaged layer in which C and F are implanted into the silicon-containing portion exposed in the bottom portion of the pattern is formed by the plasma-etching.

5. The etching method of claim 4, wherein the forming the oxide is performed using plasma generated by an oxygen-containing gas and a fluorine-containing gas.

6. The etching method of claim 5, wherein the oxygen-containing gas is $O_2$ gas, and
the fluorine-containing gas is $NF_3$ gas, $SF_6$ gas, or $F_2$ gas.

7. The etching method of claim 5, wherein a volume ratio of the fluorine-containing gas to the oxygen-containing gas is 1 volume % or less.

8. The etching method of claim 3, wherein the forming the oxide is performed by remote plasma obtained by generating the plasma in a plasma generation space separate from a processing space in which the substrate is disposed.

9. The etching method of claim 3, wherein the forming the oxide is performed at a pressure in a range of 13.3 to 266.6 Pa.

10. The etching method of claim 3, wherein the forming the oxide is performed at a temperature in a range of 0.1 to 120 degrees C.

11. The etching method of claim 1, wherein the removing the oxide including the oxide of the etching residue is performed by chemical processing using a processing gas containing a fluorine-containing gas.

12. The etching method of claim 11, wherein the processing gas containing the fluorine-containing gas contains the fluorine-containing gas and $H_2O$ gas or a reducing gas.

13. The etching method of claim 12, wherein the processing gas containing the fluorine-containing gas contains hydrogen fluoride gas as the fluorine-containing gas and contains $NH_3$ gas as the reducing gas.

14. The etching method of claim 13, wherein the removing the oxide is performed at a pressure in a range of 6.66 to 400 Pa.

15. The etching method of claim 13, wherein the removing the oxide is performed at a temperature in a range of 0.1 to 120 degrees C.

16. The etching method of claim 13, wherein the removing the oxide comprises removing a generated ammonium fluoride compound by heating after the chemical processing.

17. The etching method of claim 1, wherein the removing the oxide including the oxide of the etching residue is performed by radical processing using F radicals and N radicals formed by activating a processing gas containing $NF_3$ gas and $NH_3$ gas.

18. A method of removing an etching residue, which is a CF-based deposit generated during plasma-etching a substrate to form a predetermined pattern on the substrate using plasma of a processing gas containing a CF-based gas, the method comprising:

forming an oxide of the etching residue, which is the CF-based deposit generated during the plasma-etching, and an oxide of a damaged layer, which is formed at a bottom portion of the pattern by the plasma-etching, by supplying fluorine-containing radicals to remove a surface of the damaged layer and supplying oxygen-containing radicals to form the oxide of the etching residue and the oxide of the damaged layer; and removing the oxide of the etching residue and the oxide of the damaged layer by radical processing or chemical processing using a gas.

19. The method of claim 18, wherein the forming the oxide is performed using plasma generated by $O_2$ gas alone or by $O_2$ gas and at least one of $H_2$ gas and a rare gas.

20. The method of claim 18, wherein a portion of the substrate subjected to the plasma-etching is formed on a silicon-containing portion, and the damaged layer in which C and F are implanted into the silicon-containing portion exposed in the bottom portion of the pattern is formed by the plasma-etching.

21. The method of claim 20, wherein the forming the oxide is performed using plasma generated by an oxygen-containing gas and a fluorine-containing gas.

22. The method of claim 21, wherein the oxygen-containing gas is $O_2$ gas, and
the fluorine-containing gas is $NF_3$ gas, $SF_6$ gas, or $F_2$ gas.

23. The method of claim 21, wherein a volume ratio of the fluorine-containing gas to the oxygen-containing gas is 1 volume % or less.

24. The method of claim 18, wherein the forming the oxide is performed by remote plasma obtained by generating the plasma in a plasma generation space separate from a processing space in which the substrate is disposed.

25. The method of claim 18, wherein the removing the oxide including the oxide of the etching residue is performed by chemical processing using a processing gas containing HF gas and $NH_3$ gas.

26. The method of claim 18, wherein the removing the oxide including the oxide of the etching residue is performed by radical processing using F radicals and N radicals formed by activating a processing gas containing $NF_3$ gas and $NH_3$ gas.

27. A non-transitory storage medium that stores a program operating on a computer to control a processing system, wherein the program causes, when executed, the computer to control the processing system such that the etching method of claim 1 is performed.

* * * * *